(12) United States Patent
Lo Iacono et al.

(10) Patent No.: US 7,711,761 B2
(45) Date of Patent: May 4, 2010

(54) METHOD AND SYSTEM FOR DIGITAL SIGNAL PROCESSING, PROGRAM PRODUCT THEREFOR

(75) Inventors: Daniele Lo Iacono, Bergamo (IT); Marco Ronchi, Cavenago Brianza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1240 days.

(21) Appl. No.: 11/179,027

(22) Filed: Jul. 11, 2005

(65) Prior Publication Data

US 2006/0020653 A1 Jan. 26, 2006

(30) Foreign Application Priority Data

Jul. 13, 2004 (EP) .................................. 04016429

(51) Int. Cl.
*G06F 15/00* (2006.01)
(52) U.S. Cl. ....................... 708/204; 708/493
(58) Field of Classification Search .................. 708/204, 708/493
See application file for complete search history.

(56) References Cited

U.S. PATENT DOCUMENTS 5,831,880 A * 11/1998 Lee .............................. 708/319
7,257,609 B1 * 8/2007 Kosunen et al. ............. 708/493

FOREIGN PATENT DOCUMENTS

EP 0 326 182 A2 8/1889

OTHER PUBLICATIONS

Hashemian, R., "A New Method for Conversion of a 2's Complement to Canonic Signed Digit Number System and its Representation," in *Proceedings of the 30th Asilomar Conference on Signals, Systems and Computers*, Pacific Grove, CA, Nov. 3-6, 1996, pp. 904-907.
Hashemian, R., "A New Number System for Faster Multiplication," in *Proceedings of the IEEE 39th Midwest Symposium on Circuits and Systems*, Ames, IA, Aug. 18-21, 1996, pp. 681-684.

(Continued)

*Primary Examiner*—Chuong D Ngo
(74) *Attorney, Agent, or Firm*—Lisa K. Jorgeson; E. Russell Tarleton; Seed IP Law Group PLLC

(57) ABSTRACT

A system, such as, e.g., a multiplier, for processing digital signals by using digital signals in the Canonic Signed Digit representation, the system including an input element to make the digital signals available in the Binary Canonic Signed Digit representation, a converter to convert the digital signals into Canonic Signed Digit representation for use in processing. The input element may be a memory where the signals are stored in the Binary Canonic Signed Digit representation. Alternatively, the input element is adapted to be fed with digital signals in the two's complement representation, and includes at least one converter to convert the digital signals from the two's complement representation into the Binary Canonic Signed Digit representation. This preferably occurs via the T2I transformation, which leads to generating signals in the Canonic Signed Digit representation, which are then converted to the Binary Canonic Signed Digit representation.

10 Claims, 12 Drawing Sheets

OTHER PUBLICATIONS

Lo Iacono, D., et al., "Serial Block Processing for Multi-Code WCDMA Frequency Domain Equalization," in *Proceedings of the IEEE Wireless Communications and Networking Conference*, New Orleans, LA, Mar. 2005, 8 pages.

Koc, C., "Parallel Canonical Recoding," *Electronics Letters*, 32(22):2063-2064, Oct. 24, 1996.

Koren, I., *Computer Arithmetic Algorithms*, $2^{nd}$ Ed., A.K. Peters, Natick, Massachusetts, 2002, Chapter 6, "High-Speed-Multiplication," pp. 141-149.

Ma, G-K., et al., "Multiplier Policies for Digital Signal Processing," *IEEE ASSP Magazine*, pp. 6-20, Jan. 1990.

Peled, A., "On the Hardware Implementation of Digital Signal Processors," *IEEE Trans. on Acoustics, Speech, and Signal Processing, ASSP 24* (1):76-86, Feb. 1976.

Sklansky, J., "Conditional-Sum Additional Logic," *IRE Trans. on Electronic Computers, EC-9* (2):226-231, Jun. 1960.

* cited by examiner

METHOD AND SYSTEM FOR DIGITAL SIGNAL PROCESSING, PROGRAM PRODUCT THEREFOR

BACKGROUND OF THE INVENTION

1. Field of the Invention

The present invention relates to digital signal processing, including computer arithmetic, low-power and high-speed architectures and, more particularly, to blocks for low-area multipliers, and in general for complex signal processing involving multiplications with variable coefficients, such as scalable FFT, adaptive digital filters, and any kind of application that requires multiplying a N-bit signal with a M-bit dynamic coefficient, and related methodology.

2. Description of the Related Art

Canonic Signed Digit (CSD) encoding/decoding operations are well known, and a significant literature exists on that topic. In A. Peled, "On the hardware implementation of digital signal processors", IEEE Transactions on Acoustics, Speech, and Signal Processing, vol. 24(1), pp. 76-78, February 1976, the Canonic Signed Digit encoding properties have been extensively explored.

Binary Canonic Signed Digit (BCSD) encoding has been introduced in R. Hashemian, "A New Method for Conversion of a Two Complement to Canonic Signed Digit Number System and its Representation", IEEE Thirtieth Asilomar Conference on Signals Systems and Computers, vol. 2, pp. 904-906, November 1996, with special emphasis placed on computer programming. This document discloses an algorithm that performs the Binary Canonic Signed Digit encoding of a number in two's complement notation using a procedure written in C language. The procedure proposed is not suitable for hardware implementation.

Moreover, no mention is made of any Binary Canonic Signed Digit decoding process, "decoding" being intended to designate the process aimed at recovering the Canonic Signed Digit notation for subsequent Canonic Signed Digit processing.

A further document of interest in this area is U.S. Pat. No. 4,623,872, which discloses a circuit for CSD-coding of binary numbers represented in two's complement.

BRIEF SUMMARY OF THE INVENTION

In view of the foregoing, the need is felt for an efficient hardware implementation of a method of processing digital signals involving the use of digital signals in the Canonic Signed Digit (CSD) representation, possibly involving encoding a number in two's complement notation into its Binary Canonic Signed Digit notation.

More specifically, the need is felt for an arrangement for decoding a Binary Canonic Signed Digit number into its Canonic Signed Digit notation. Binary Canonic Signed Digit encoding is a serial, recursive algorithm.

According to the disclosed embodiments of the present invention, a method and device is provided having the features set forth in the claims that follow. In one embodiment, the invention relates to a computer program product, loadable in the memory of at least one computer and including software code portions for performing the steps of the method of the invention when the product is run on a computer. As used herein, reference to such a computer program product is intended to be equivalent to a reference to a computer-readable medium containing instructions for controlling a computer system to coordinate the performance of the method of the invention. Reference to "at least one computer" is evidently intended to highlight the possibility for the present invention to be implemented in a distributed/modular fashion.

The solution described herein performs the Binary Canonic Signed Digit encoding operation splitting the recursive algorithm into three steps: the parallel pre-processing, the recursive serial processing, and the parallel post-processing.

Moreover, the remaining recursive processing is carried on using low-latency parallel structures in order to reduce the overall processing time, which is the limiting element in the Canonic Signed Digit processing techniques. The Binary Canonic Signed Digit decoding scheme takes advantage of the BCSD digits to perform the Binary Canonic Signed Digit decoding back to its Canonic Signed Digit notation.

In accordance with one embodiment of the invention, a method of processing digital signals is provided, the method including the steps of making the digital signals available in Binary Canonic Signed Digit representation, and converting the digital signals made available in Binary Canonic Signed Digit representation into Canonic Signed Digit representation for use in processing.

In accordance with another aspect of the foregoing embodiment, the Binary Canonic Signed Digit representation is in sign-extended encoding, and the processing includes a step of multiplication using the CSD representation. During processing the digital signals are dynamically varied, and they can be made available in two's complement representation to produce BCSD representation or to produce CSD representation from which is produced the BCSD representation. The two's complement representation into CSD representation can be done via the inverse two's complement transformation, including subjecting the digital signals in the two's complement representation to processing a parallel-prefix structure or by means of the Sklansky parallel-prefix algorithm.

In accordance with another embodiment of the invention, a system for processing digital signals is provided, the system including an input element configured to make the digital signals available in Binary Canonic Signed Digit representation, and a converter to convert the digital signals made available in the Binary Canonic Signed Digit representation into Canonic Signed Digit representation for use in processing.

In accordance with another embodiment of the invention, a digital signal processing method is provided that includes converting the digital signals into Binary Canonic Signed Digit representation using sign-extended coding, and converting the BCSD representation into Canonic Signed Digit representation for use in a multiplication operation.

In accordance with yet a further embodiment of the invention, an electronic circuit is provided that includes an input element configured to receive digital signals and to convert the digital signals into Binary Canonic Signed Digit representation using sign-extended encoding, a converter configured to receive the BCSD representation and to output a Canonic Signed Digit representation, and a multiplier adapted to be fed with the CSD representation.

BRIEF DESCRIPTION OF THE SEVERAL VIEWS OF THE DRAWINGS

The invention will now be described, by way of example only, with reference to the enclosed figures of drawing, wherein.

DETAILED DESCRIPTION OF THE INVENTION

Figure 1:
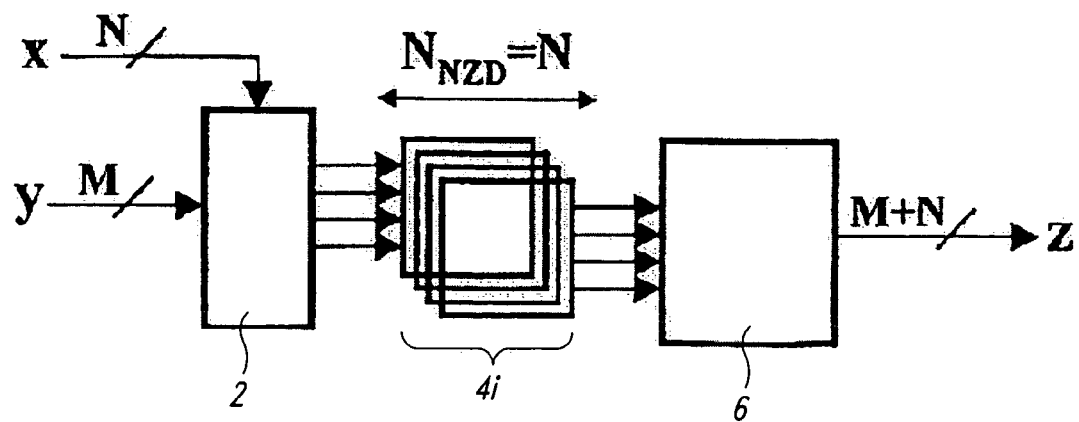
FIG. 1 shows a two's complement multiplication of a M-bit signal and a N-bit coefficient.

The two's complement notation for a given number x is:

$$x = \sum_{n=0}^{N-2} a_n \cdot 2^n - a_{N-1} \cdot 2^{N-1} \quad (1)$$

where $a_n$ belongs to the binary alphabet $a_n \in \{0, 1\}$. A two's complement multiplication of a N-bit coefficient x and a M-bit signal y, to produce an M+N-bit output signal z thus requires a N-adder tree, as shown in FIG. 1.

There, reference 2 designates a selector having as its inputs x and y, which are the N-bit coefficient and the M-bit signal respectively. Reference 4$i$ designates any one of a bank of N Shift Left (SHL) elements, and reference 6 designates an adder tree.

The Signed Digit (SD) ternary representation of a given number x is:

$$x = \sum_{n=0}^{N-2} s_n \cdot 2^n \quad (2)$$

where $s_n$ belongs to the ternary alphabet $s_n \in \{-1, 0, 1\}$. Signed Digit multiplications allow reducing the number of Non-Zero Digits (NZDs), thus reducing the complexity of the adder tree.

Among the Signed Digit representations, the Canonic Signed Digit (CSD) representation of a given number x is the minimal SD representation, i.e., the representation having minimal number of Non-Zero Digits. The Canonic Signed Digit representation of x is unique.

It has been demonstrated that a Canonic Signed Digit number has a maximum number of Non-Zero Digits equal to N/2 (N even), while the average number of Non-Zero Digits is about N/3.

The inverse two's complement is a ternary representation of a binary number x. The T2I transformation is the transformation of a two's complement number into its inverse two's complement representation, the expression "T2I" being in fact a sort of acronym of "Two's complement notation 2 (to) Inverse two's complement notation".

The T2I transformation can be accomplished by first finding the two's complement of x and then replacing all '1' by '−1', except for the Most Significant Bit, which remains unchanged. The inverse two's complement transformation of each number is unique.

While the two's complement notation of a given number is a binary representation of the number, the T2I transformation can be seen like an intermediate step in order to transform a number represented in its two's complement notation in its CSD representation. So, the T2I is a transformation that maps a number given in its two's complement notation into a new ternary representation.

The CSD representation of a number, made available in its two's complement notation, can be obtained operating the T2I transformation on each Optimally Convertible Block inside the given number.

An Optimally Convertible Block (OCB) is a block of consecutive digits of a binary number x that starts with the couple '11' and ends with the first zero of the couple '00' or with the end of the word itself. More than one Optimally Convertible Block can be found within x.

Any other block within x that cannot be marked as Optimally Convertible Block will be called Non-optimally Convertible Block (NCB).

For a given binary number x represented in two's complement notation, the number of Non-Zero Digits can be reduced to a minimum if every Optimally Convertible Block found within x is converted using the T2I transformation. Accordingly, a ternary number generated by the former method is a Canonic Signed Digit number. This is shown, e.g., in G. K. Ma, F. J. Taylor, "Multiplier Policies for Digital Signal Processing", IEEE ASSP Mag. NO.1, pp.6-20, January 1990.

A N-bit Canonic Signed Digit word has a total number of Non-Zero Digits that never exceeds N/2 (N even). As a drawback, the Canonic Signed Digit number word size is twice (2N) the word length of the corresponding two's complement number (N). This is because each CSD digit shall be represented over two-bits.

If $(x_n)_{CSD}$ is a Non-Zero Digit within a Canonic Signed Digit number, then $(x_{n+1})_{CSD}$ is always zero, i.e., only the couples '01' or '0−' can be found within a Canonic Signed Digit number.

The zero digit $(x_{n+1})_{CSD}$ can thus be used to code the sign of the preceding digit $(x_n)_{CSD}$, i.e., mapping the couples '01' and '0−' into '01' and '11' respectively. The Binary CSD encoding does not introduce representation overhead.

This leads again to a binary number that is called "Binary CSD" (BCSD). Since the CSD notation for a two's complement number is unique, and given that the CSD/BCSD transformation is unique, the two's complement to BCSD transformation is unique as well, i.e., there is a one-to-one correspondence between a two's complement number and its Binary CSD representation.

A recursive linear equation in the form:

$$c_{n+1} = p_n \cdot c_n + g_n \quad (3)$$

can be solved by serially evaluating each term as a function of the previous one. Thus, it has a complexity of N and a latency of N.

Figure 2:
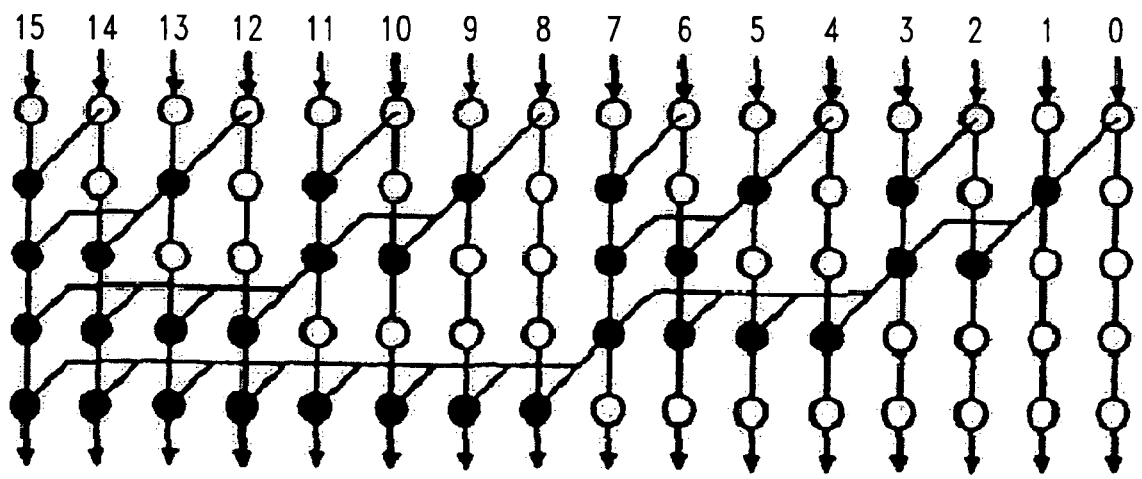
FIG. 2 is a schematic representation of a so-called Sklansky Parallel-Prefix algorithm for N=16.

If highspeed is needed, any Parallel-Prefix structure can be conveniently used. FIG. 2 schematically shows the so-called Sklansky Parallel-Prefix algorithm for a N=16 digits recursive formula. Further details on the Sklansky Parallel-Prefix algorithm can be found in J. Sklansky "Conditional sum addition logic", IRE Transaction on Electronic Component, vol. 9(6), pp. 226-231, June 1960.

The complexity of the Sklansky algorithm is $N/2 \cdot \log_2(N)$ while the tree depth is $\log_2(N)$, thus it is sensibly faster than the serial algorithm in front of a slightly higher complexity.

Figure 3:
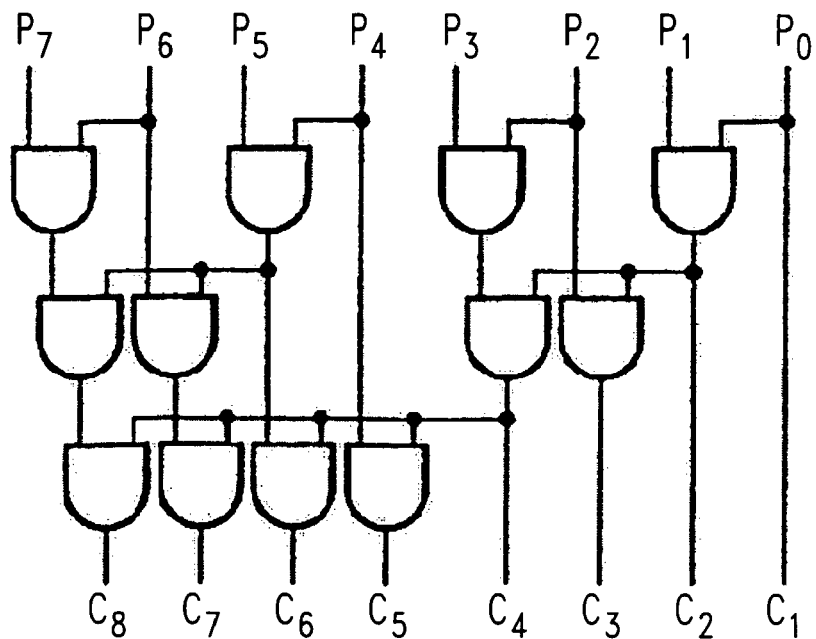
FIG. 3 shows a circuital representation of a Sklansky algorithm.

For instance, assuming for simplicity $g_n=0$ in equation (3), the recursive formula $c_{n+1}=p_n \cdot c_n$ can be solved by means of the circuit shown in FIG. 3, where N=8 and $c_0=1$. This arrangement can be conveniently implemented as a combinatory network of AND gates, e.g., as shown in FIG. 3. According to the following equation:

$$\begin{aligned}
C_{n+1} &= p_n \cdot c_n \quad (4)\\
&= p_n \cdot (p_{n-1} \cdot c_{n-1})\\
&= p_n \overline{(\overline{p_{n-1} + \overline{c_{n-1}}})}\\
&= \overline{\overline{p_n} + (\overline{p_{n-1} + \overline{c_{n-1}}})}\\
&= \overline{\overline{p_n} + \overline{p_{n-1} \cdot c_{n-1}}}
\end{aligned}$$

Figure 4:
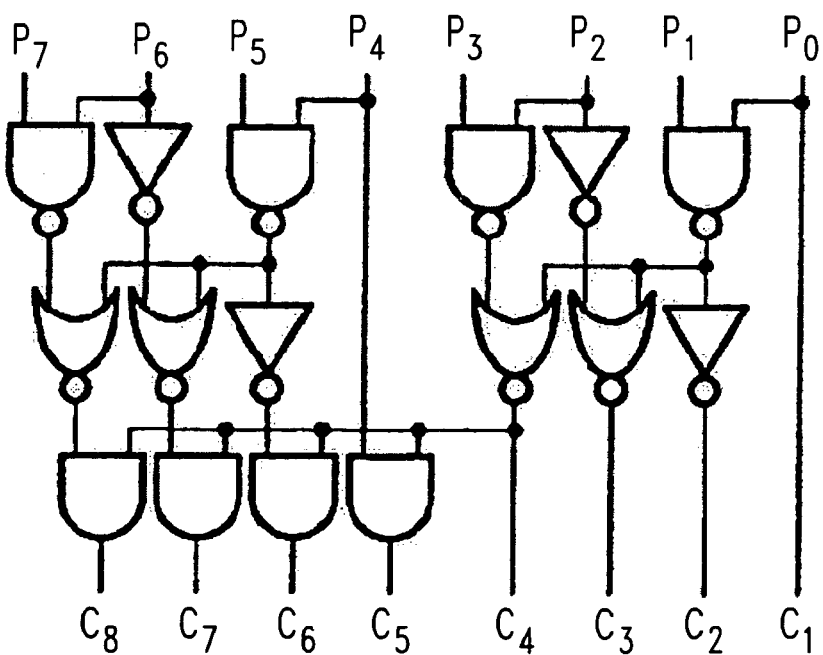
FIG. 4 shows the NAND-NOR-NOT version of the Sklansky circuit of FIG. 3.

FIG. 4 shows an alternative NAND/NOR/NOT version of the circuit of FIG. 3.

In both FIGS. 3 and 4 the logical gates shown (of the AND, NAND, NOR and NOT type) are represented by using their canonic representations, thus making it unnecessary to insert reference numerals. The references $p_0$ to $p_7$ and $c_1$ to $c_8$ designate the individual digits of the numbers $p_n$ and $c_n$.

Those of skill in the art will be in a position to easily derive further, equivalent embodiments of the same function.

An indicator, which "flags" the presence of all the Optimally Convertible Blocks within the input word x, is introduced. The Optimally Convertible Blocks detector b must detect the couple '11' and '00', i.e., the beginning and the end of each Optimally Convertible Block.

Figure 5:
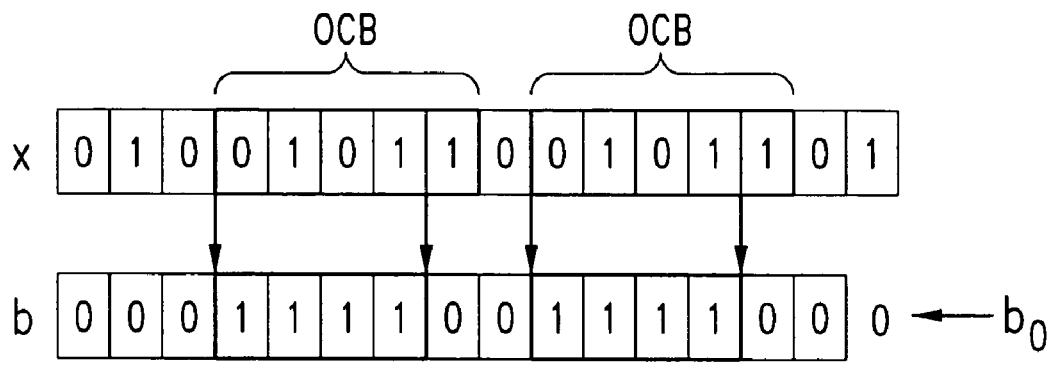
FIG. 5 shows an example of an Optimally Convertible Block (OCB) indicator.

For reasons that will be explained later, it is convenient that the Optimally Convertible Block (OCB) detector may flag (i.e., set the corresponding bit to one) all the digits within each Optimally Convertible Block without flagging the Least Significant Bit of the Optimally Convertible Block itself, as in the example of FIG. 5, where the OCB detector function is schematically indicated as b.

Prior to performing the Optimally Convertible Block detection the input word x may be sign-extended to retain the information on the sign of the signal.

Figure 6:
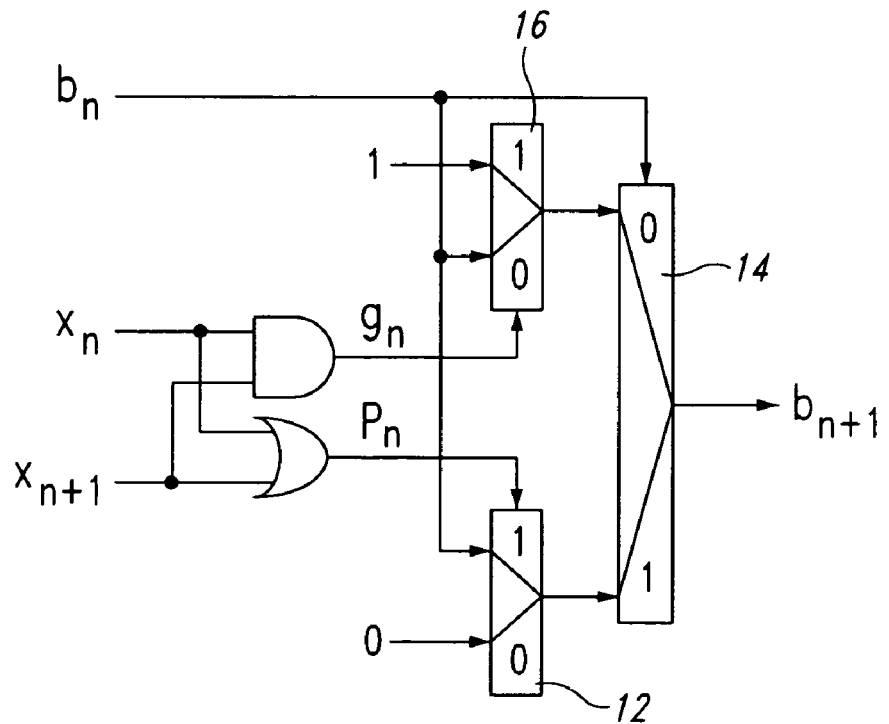
FIG. 6 shows an Optimally Convertible Block detector.

The Optimally Convertible Block (OCB) detector can be implemented as in FIG. 6.

Starting from $b_o=0$, the Optimally Convertible Block detector can be expressed by the following recursive equation:

$$b_{n+1} = (g_n + b_n \cdot \overline{g_n}) \cdot \overline{b_n} + p_n \cdot b_n \quad (5)$$

where:

$$g_n = x_n \cdot x_{n+1} \quad (6)$$
$$p_n = x_n + x_{n+1}$$

Figure 7:
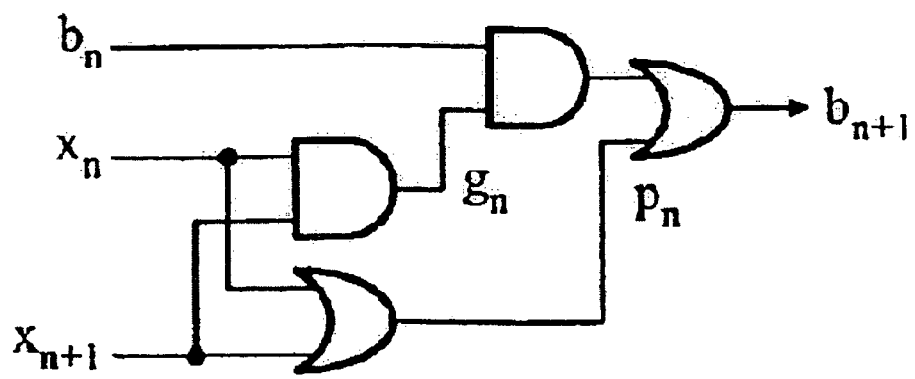
FIG. 7 shows a simpler version of the Optimally Convertible Block detector of FIG. 6.

It is easy to show that the Optimally Convertible Block detector can also be written as:

$$b_{n+1} = (x_n + x_{n+1}) \cdot b_n + x_n \cdot x_{n+1} = p_n \cdot b_n + g_n \quad (7)$$

which corresponds to the circuit shown in FIG. 7.

Once again, the AND/OR gates shown in these Figures have not been allotted specific reference numerals. Conversely, reference 12, 14, and 16 in FIG. 6 designate respective selector blocks whose output is set to either of the input values (0, 1) depending on the value of the input bits $p_n$, $b_n$, and $g_n$, respectively.

Figure 8:
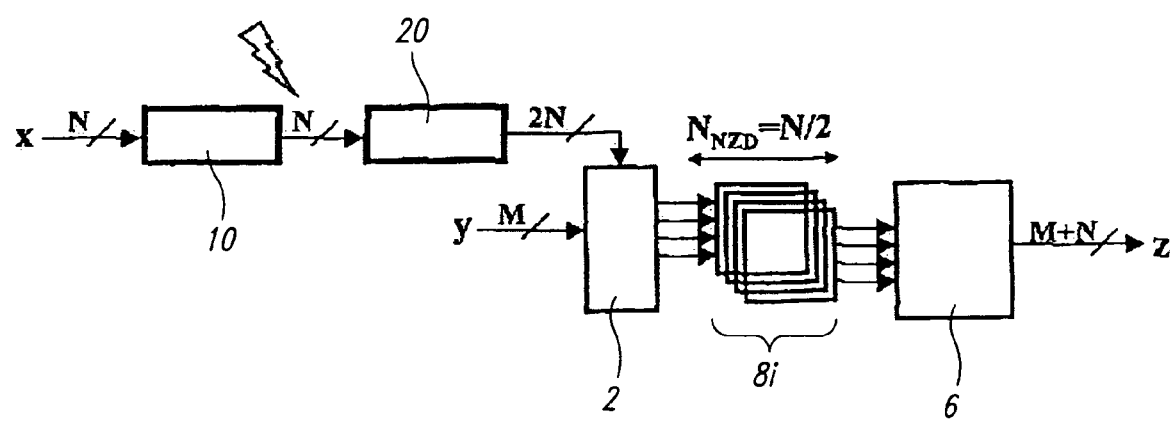
FIG. 8 shows a encoder/decoder chain.

FIG. 8 shows a chain where reference 10 is a block acting as a "source" for a number x in a BCSD notation.

In a first possible embodiment, the block 10 may be simply comprised of a memory where the number x—in the BCSD notation—has been previously stored.

Alternatively (this is the embodiment specifically referred to in FIG. 8) the block 10 is comprised of an encoder that maps a N-bit number x in its two's complement notation into its BCSD notation (over N bits).

In either case a decoder 20 is provided in order to map the BCSD number into its CSD notation that uses 2N bits.

Reference 2 designates the selector having as its inputs:
the signal x from block 20 presented in its CSD notation over 2N bits, and
the M-bit coefficient y.

Reference 8i designates any one of a bank of N/2 Shift Left (SHL) elements, and finally, reference 6 designates the adder tree.

Direct comparison of the arrangements shown in FIG. 1 and FIG. 8 shows that in the arrangement of FIG. 8 there are only N/2 SHL elements 8i, while in the case of FIG. 1 there are N SHL elements 4i.

If an encoder is used in the place of a memory as the block 10, a possible approach in producing the number x in the BCSD format is to start from the number in the two's complement notation, convert it to the CSD format by exploiting the T2I transformation and then convert the CSD number into the BCSD format. Despite the notional complexity, such an approach lends itself to an efficient, fast and simple hardware implementation.

A critical point in implementing the Binary CSD encoder architecture is the Optimally Convertible Blocks detection, which consists of the following recursive equation:

$$b_{n+1} = p_n \cdot b_n + g_n \quad (8)$$

Equation (8) is in the form of equation (3) and can be easily implemented in serial or parallel way, where in the latter case any parallel-prefix structure can be used.

Equation (8) can be carried out, e.g., by the Sklansky Parallel-Prefix algorithm. Both $p_n$ and $g_n$ can be evaluated in parallel prior to feeding them into the Sklansky tree.

Figure 9:
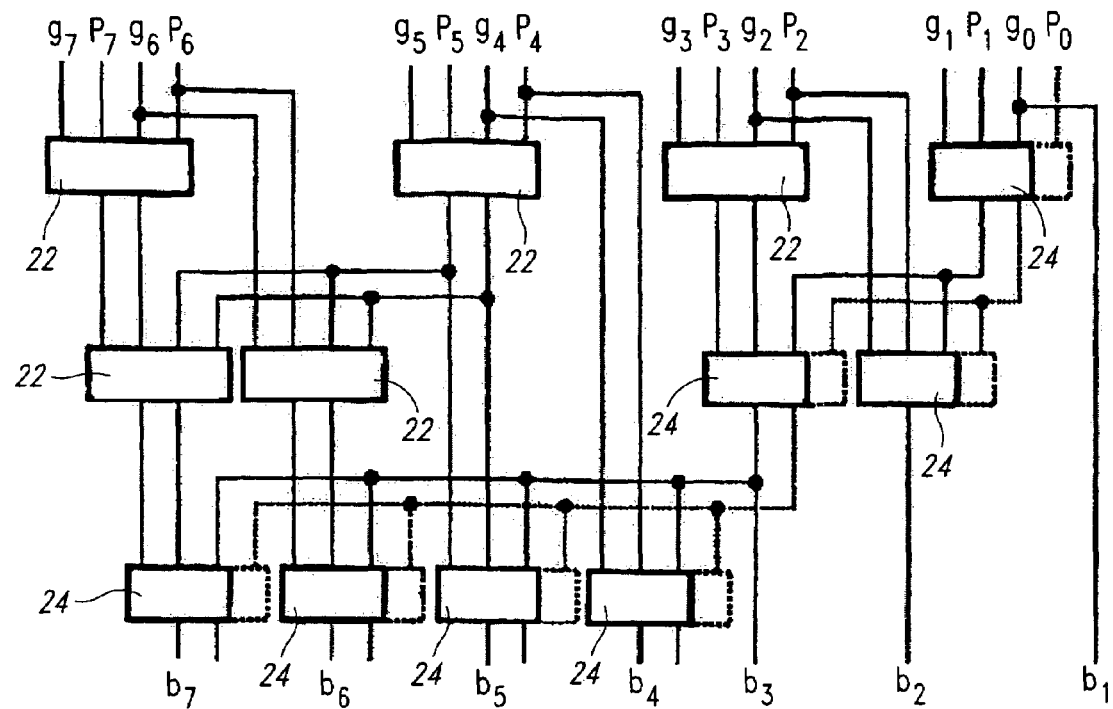
FIG. 9 shows an example of a Sklansky structure with full and half cells.
Figure 10:
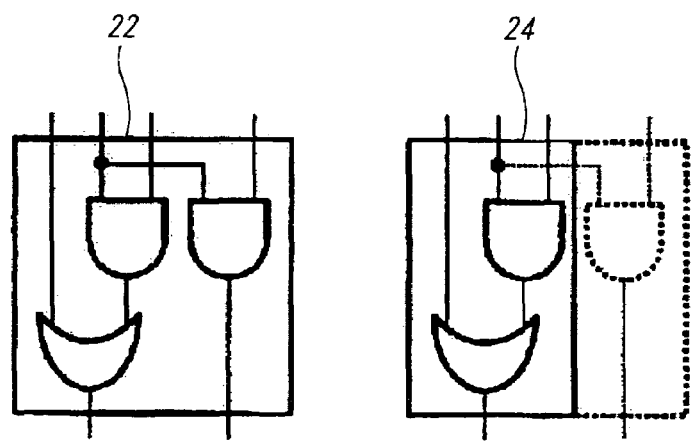
FIG. 10 shows the logic within the full and half cells of FIG. 9.

FIG. 9 shows an example of Sklansky structure for N=8, where $b_0=0$. Specifically, in the network shown in FIG. 9, reference numerals 22 and 24 designate so-called Full and Half cells corresponding to the block diagrams shown in FIG. 10 (once again, the AND/OR gates shown therein are represented by means of their standard graphical representation).

The inverse two's complement transformation (T2I) has to be performed by first evaluating the two's complement of each Optimally Convertible Blocks, and then substituting each '1' with '−1' except for the Most Significant Bit which shall remain unchanged. Since each Optimally Convertible Block begins with '11', the two's complement of an Optimally Convertible Block z of size m can be easily performed as follows:

$$-z = \bar{z}+1 = 1\bar{z}_{M-2}\ldots\bar{z}_2 01 \quad (9)$$

which means performing the bit-wise inversion of the OCB bits while excluding the LSB.

The two's complement can thus be evaluated by simply performing the one's complement of the Most Significant Bit of each Optimally Convertible Block while leaving its Least Significant Bit unchanged. This is the reason why the Optimally Convertible Block detector does not flag the Least Significant Bit of each Optimally Convertible Block.

The first step of the inverse two's complement transformation can then be accomplished by applying the Optimally Convertible Block detector b to the word x by means of a controlled one's operator:

$$d_n = x_n \oplus b_n \quad (10)$$

It has to be noted that d flags the position of all the Non-Zero Digits within the Canonic Signed Digit coding of x, without giving any information about the sign of these Non-Zero Digits.

To obtain the Canonic Signed Digit representation of x, each Non-Zero Digit within d corresponding to an Optimally Convertible Block must be replaced by '−1', except for the Most Significant Bit of each Optimally Convertible Block which shall remain unchanged. This suggests using the Optimally Convertible Block to directly retrieve the sign of each Non-Zero Digit.

In that respect it has to be noted that the right shift of the indicator b flags exactly each OCB while leaving out the Most Significant Bit. Sign $s_n$ can be expressed as:

$$s_n = x_{n+1} \quad (11)$$

where $$b_{n+1} = x_{n+d_n} \quad (12)$$

and it has to be assumed that indicator s is meaningful only when the indicator d point to a Non-Zero Digit.

Figure 11:
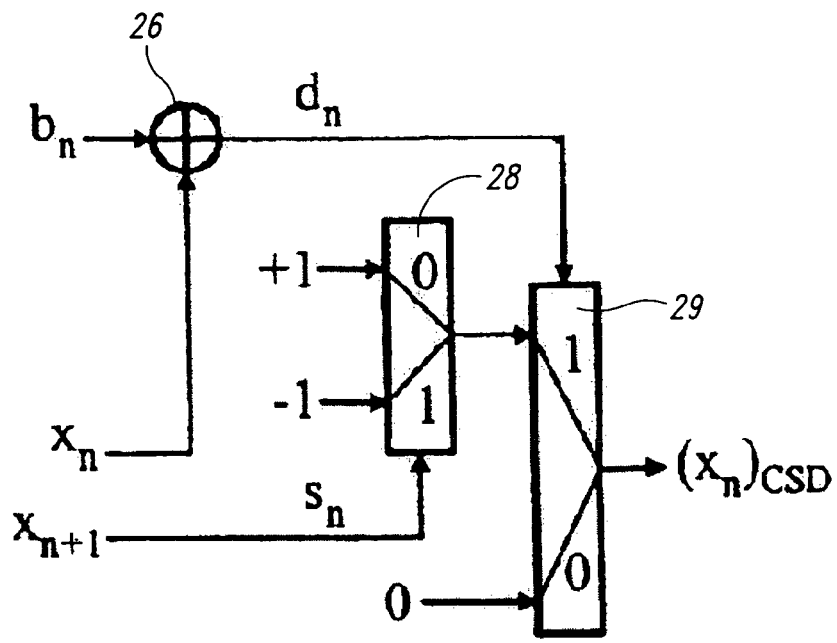
FIG. 11 shows an example of CSD encoder (in the case where the OCB was estimated)

As soon as the sign s has been determined, the Canonic Signed Digit transformation can be accomplished using the CSD encoder of FIG. 11.

There, references 28 and 29 in FIG. 11 designate respective multiplexer blocks whose output is set to either of the input values (0, 1) depending on the value of the input bits $s_n$ and $d_n$ respectively. The value of the bit $d_n$ is the result of the logical XOR operation of bits $b_n$ and $x_n$.

Figure 12:
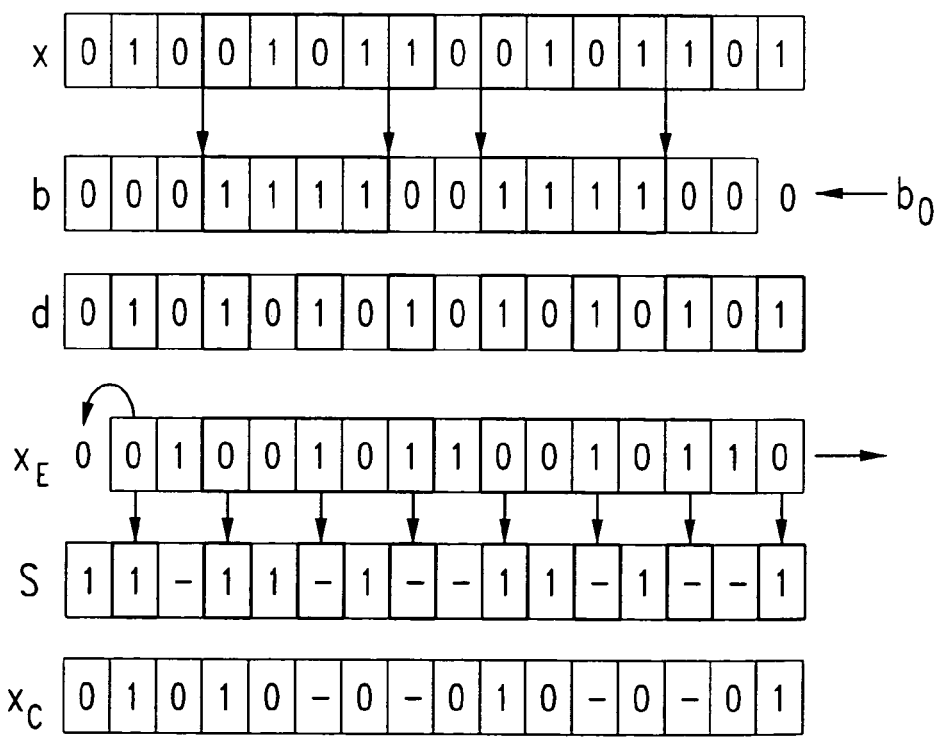
FIG. 12 shows an example of two's complement to CSD mapping process.

FIG. 12 shows an example of the overall two's complement to CSD mapping process.

To obtain the Binary CSD transform of x each couple '0−' in $(x)_{CSD}$ shall be mapped into the couple '11', while all the pairs '01' shall be unchanged.

Figure 13:
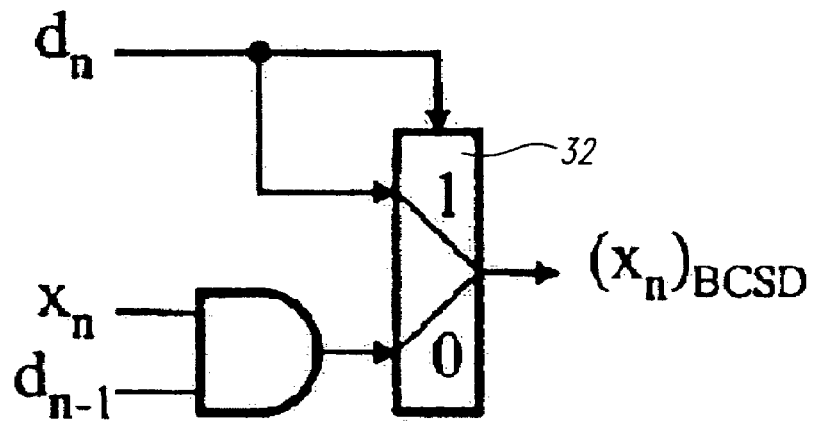
FIG. 13 shows an example of a BCSD encoder.

Since $d_n$ identifies the position of each Non-Zero Digits, while their sign can be retrieved from $x_{n-1}$, the Binary CSD mapping can be done by using both $d_n$ and $x_{n+1}$, as shown in the BCSD encoder in FIG. 13.

There, reference 32 in FIG. 13 designates a selector block whose output is set to either of the input values (0, 1) depending on the value of the input bit $d_n$.

The BCSD encoder of FIG. 13 corresponds to the following equation:

$$(x_n)_{BCSD} = d_n + x_n \cdot d_{n-1} \cdot \bar{d}_n \quad (13)$$

After some manipulations, and considering that:

$$\bar{b}_{n+1} = (\bar{x}_n + \bar{x}_{n+1}) \cdot \bar{b}_n + \bar{x}_n \bar{x}_{n+1} \quad (14)$$

equation (13) can be simplified as follows:

$$(x_n)_{BCSD} = x_n \cdot \bar{x}_{n-1} + (b_{n-1} \oplus x_n) \cdot x_{n-1} \quad (15)$$
$$= x_n \oplus (b_{n-1} \cdot x_{n-1})$$

Figure 14:
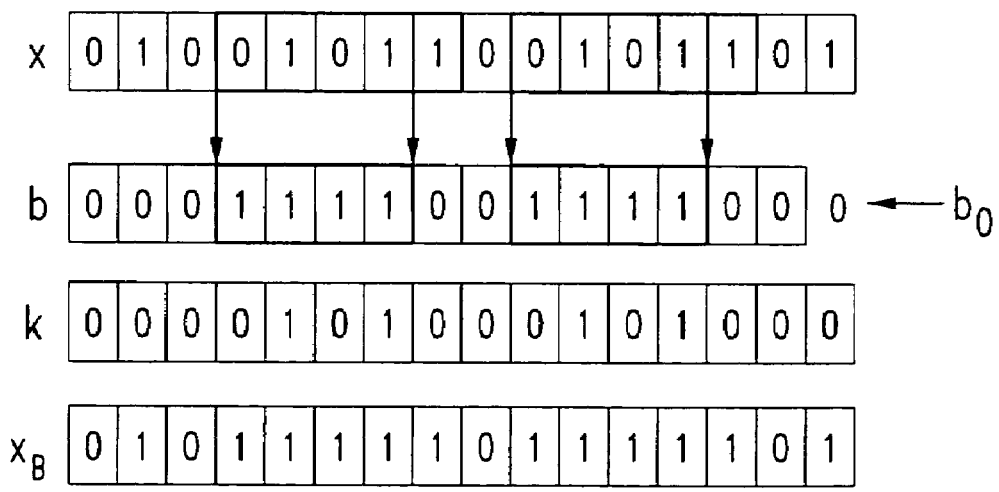
FIG. 14 shows an example of two's complement to BCSD mapping process.

FIG. 14 shows an example of the overall two's complement to BCSD mapping process.

Figure 15:
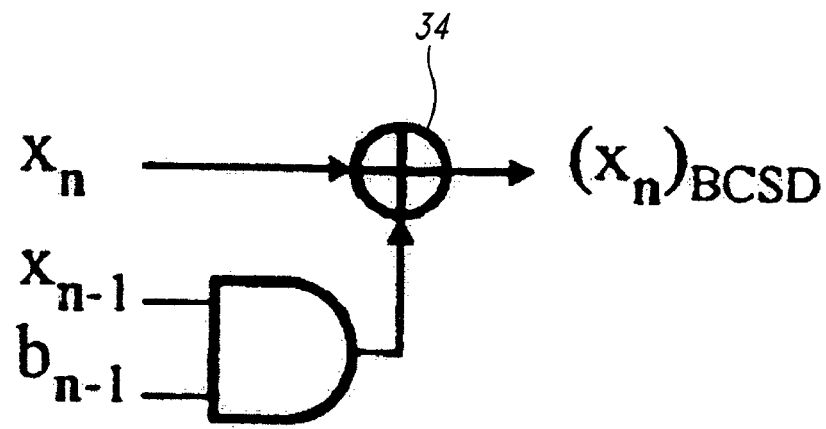
FIG. 15 shows another example of the BCSD encoder.

Binary CSD mapping can be retrieved using equation (15). It corresponds to the BCSD encoder shown in FIG. 15.

There, reference 34 designates the logical XOR operation of $x_n$ and the output of the AND gate. The output of the AND gate depends on the value of the input bits $x_{n-1}$ and $b_{n-1}$.

Figure 16:
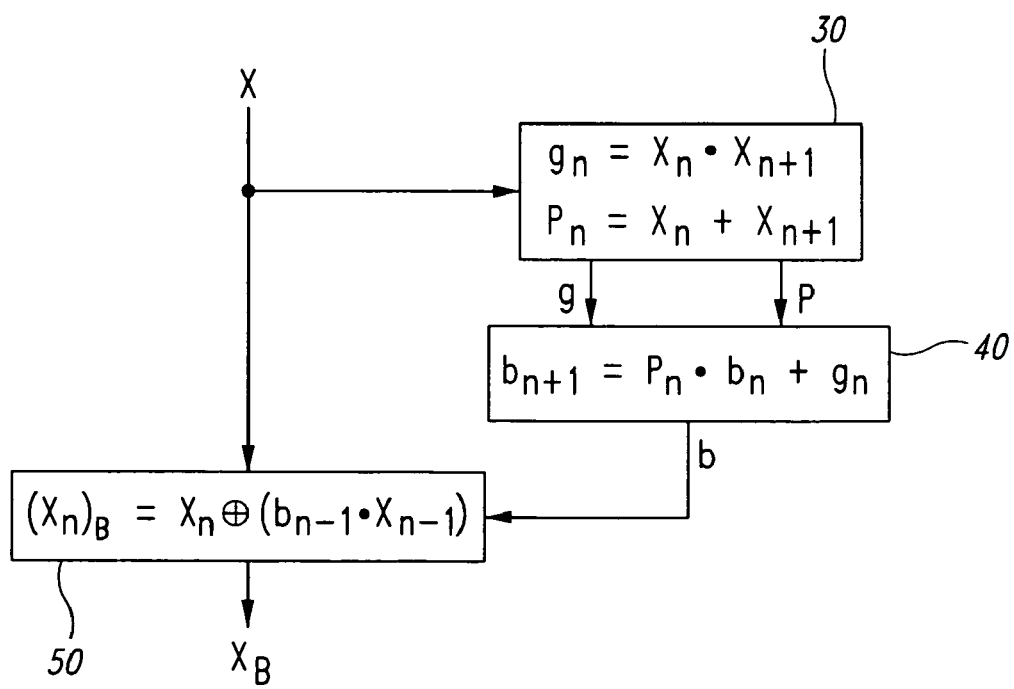
FIG. 16 shows a block diagram of the two's complement to BCSD encoder process.

FIG. 16 shows a block diagram of the two's complement to BCSD encoder process. In particular block 30 performs equation (6), block 40 performs equation (8) and block 50 performs equation (15).

The BCSD encoding does not carry any sign information on the Most Significant Bit. Sign indicator can be easily retrieved from x itself (if available) or by means of a recursive equation dealing with the representation range.

As soon as the x operand has been Binary CSD converted, the BCSD number can be converted back into its CSD notation.

Figure 17:
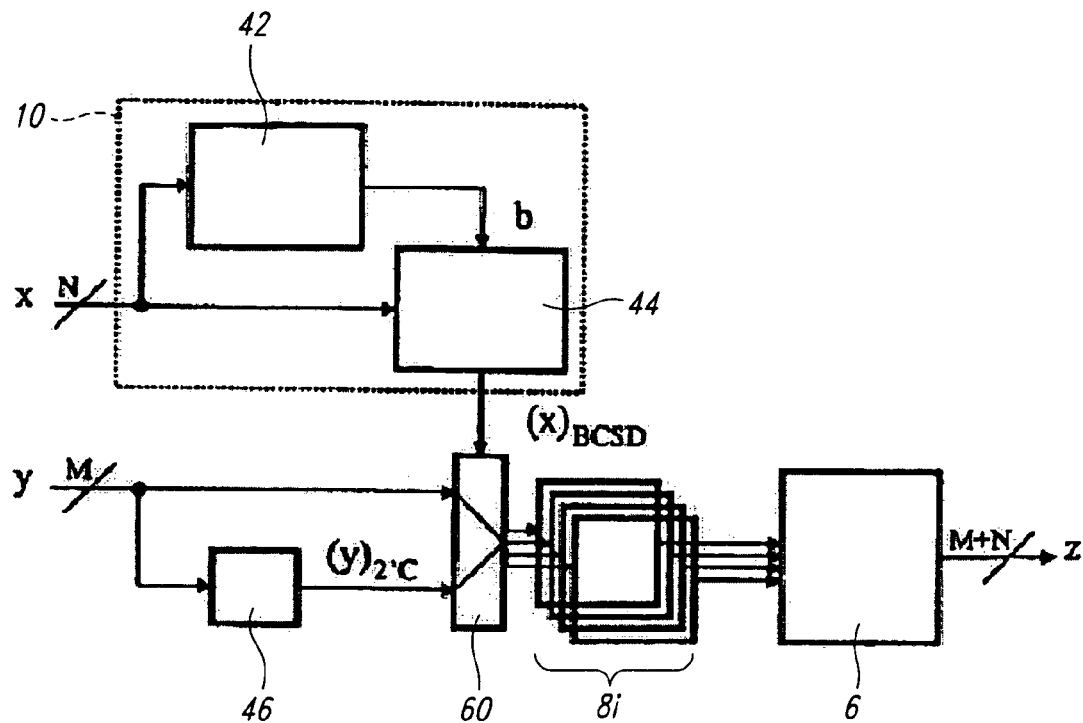
FIG. 17 shows a BCSD multiplier.

First of all, it has to be recalled that for each $(x_n)_{BCSD}$ Non-Zero Digit, the $(x_{n+1})_{BCSD}$ represent the sign of $(x_n)_{BCSD}$ digit. FIG. 17 shows a BCSD multiplier where the outer multiplexer 60 is driven by the following flag operator:

$$d_{n+1} = \bar{d}_n \cdot (x_n)_{BCSD} \quad (16)$$

There, reference 42 designates a OCB detector block and reference 44 designates a BCSD mapper block. Reference 10 designates a BCSD encoder block that comprises blocks 42 and 44.

Reference 46 designates a Two's Complement block. This block operates the two's complement of the input parameter y.

Again, reference 8i designates any one of a bank of N/2 Shift Left (SHL) elements, and reference 6 designates an adder tree.

Assuming $d_0=0$, $d_{n+1}$ flags the presence of the Non-Zero Digits taking into account that for each Non-Zero Digit, the preceding one must be zero. The inner multiplexer retrieves the sign of each Non-Zero Digit $(x_n)_{BCSD}$ according to the value of $(x_{n+1})_{BCSD}$.

Again, the flag operator $d_{n+1}$ can be conveniently implemented using a Parallel-Prefix structure.

Equation (17) shows the sign indicator operation:

$$s_{n+1} = (x_{n+1})_{BSCD} \cdot d_{n+1} + s_n \cdot \bar{d}_{n+1} \quad (17)$$
$$s_{N-1} = \bar{s}_{N-1}$$

while equation (18) shows the CSD mapping function:

$$(x_n)_{CSD} = (1-2s_n) \cdot d_n \quad (18)$$

Figure 18:
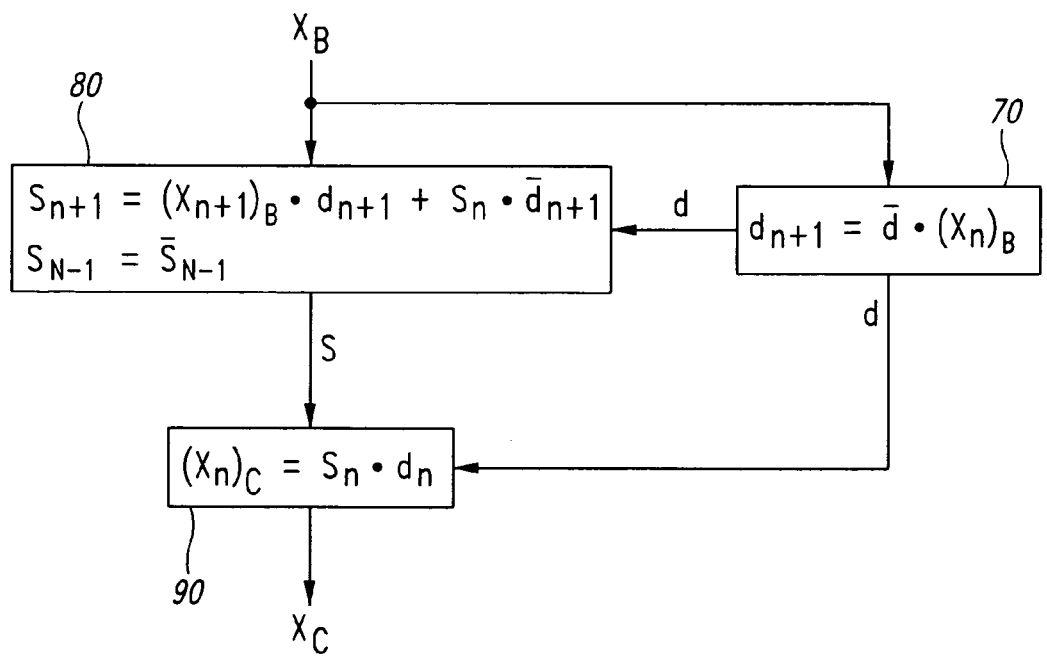
FIG. 18 shows a block diagram of the BCSD to CSD decoder process.

FIG. 18 shows a block diagram of the BCSD to CSD decoder process. In particular block 70 performs equation (16), block 80 performs equation (17) and block 90 performs equation (18).

The decoding operation can be simplified by resolving the Most Significant Bit sign ambiguity by means of extended BCSD encoding.

Such an extended BCSD encoding requires one extra bit (N+1 bits) but has the advantage of making it easier to decode back the BCSD number when the two's complement input number is not available.

As stated, sign indicator evaluation can be strongly simplified when x is BCSD encoded using the extended BCSD representation. In fact, in this case the sign information can be recovered directly from the Most Significant Bit of $x_{EBCSD}$ as shown in equation (19).

$$s_{n+1}=(x_{n+1})_{EBCSD} \tag{19}$$

An important aspect of both encoding and decoding functions resides in the recursive nature of the involved equations. Each equation having a recursive nature can be conveniently implemented using Parallel-Prefix structures. In addition (and as shown), Parallel-Prefix structures are well suited for pure NAND-NOR-NOT logic implementation.

A BCSD multiplier is the optimal choice when dealing with applications where the multiplicand can be chosen from a set of coefficients stored in a memory, such as scalable architectures and adaptive or serial signal processing.

Multipliers which make use of BCSD encoded multiplicand require only the decoding function to map the BCSD number back into its CSD notation, while introducing no memory overhead.

Figure 19:
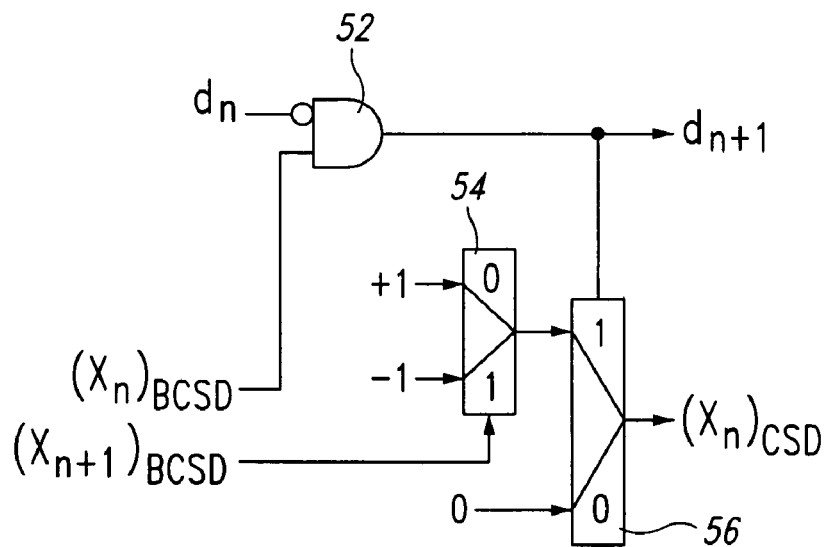
FIG. 19 shows a circuital representation of the block diagram of FIG. 18.

A circuital representation of the BCSD to CSD decoder process is shown in FIG. 19.

There, references 54 and 56 in FIG. 19 designate respective selector blocks whose output is set to either of the input values (0, 1) depending on the value of the input bits $(x_{n+1})_{BCSD}$ and $d_{n+1}$ respectively. The value of the bit $d_{n+1}$ is the result of the logical AND operation, gate 52, of bits $\bar{d}_n$ and $(x_n)_{BCSD}$.

Multiplication is carried on in the conventional way, shifting and adding the different replicas of the M-bit y operand according to the Non-Zero Digit of the N-bit x operand. In principle, a N×M bits multiplication (with N<M) requires N shift-and-add operators.

A Binary CSD multiplier requires only N/2 (with N even) shift-and-add operators, which is equivalent (and can then be fairly compared) to the Radix-4 Booth Encoding.

Figure 20:
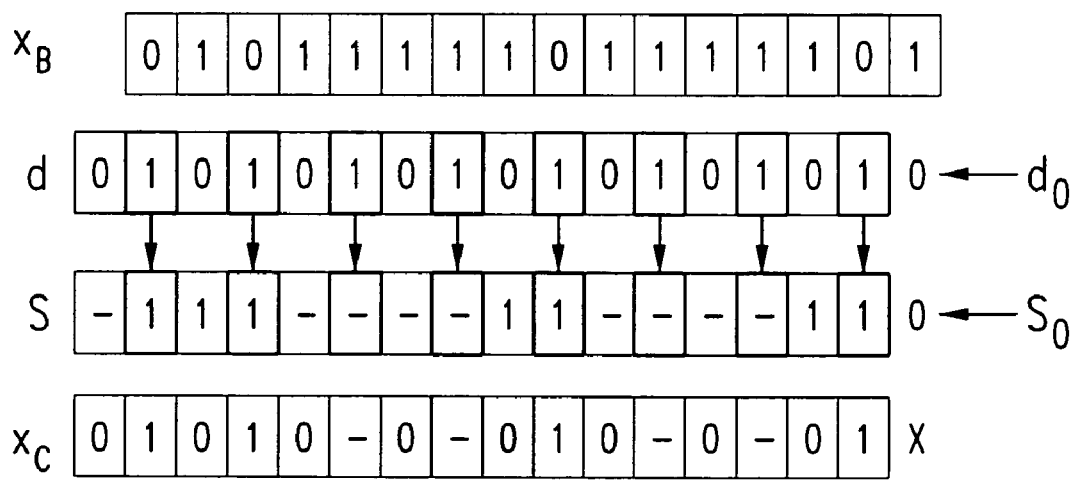
FIG. 20 shows an example of BCSD to CSD decoding process.

Finally, FIG. 20 shows an example of BCSD to CSD decoding process.

Figure 21:
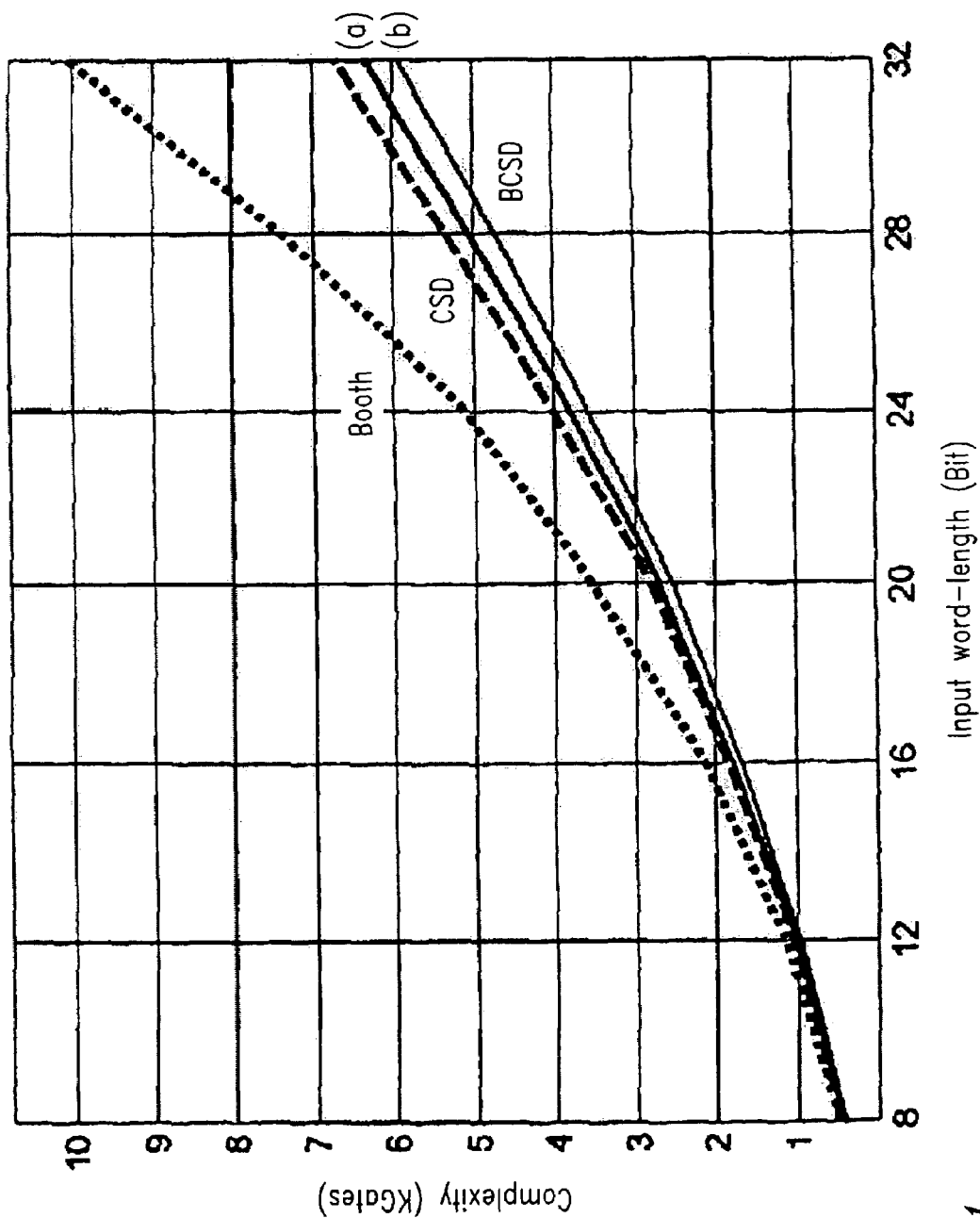
FIG. 21 shows the complexity comparison between multipliers.
Figure 22:
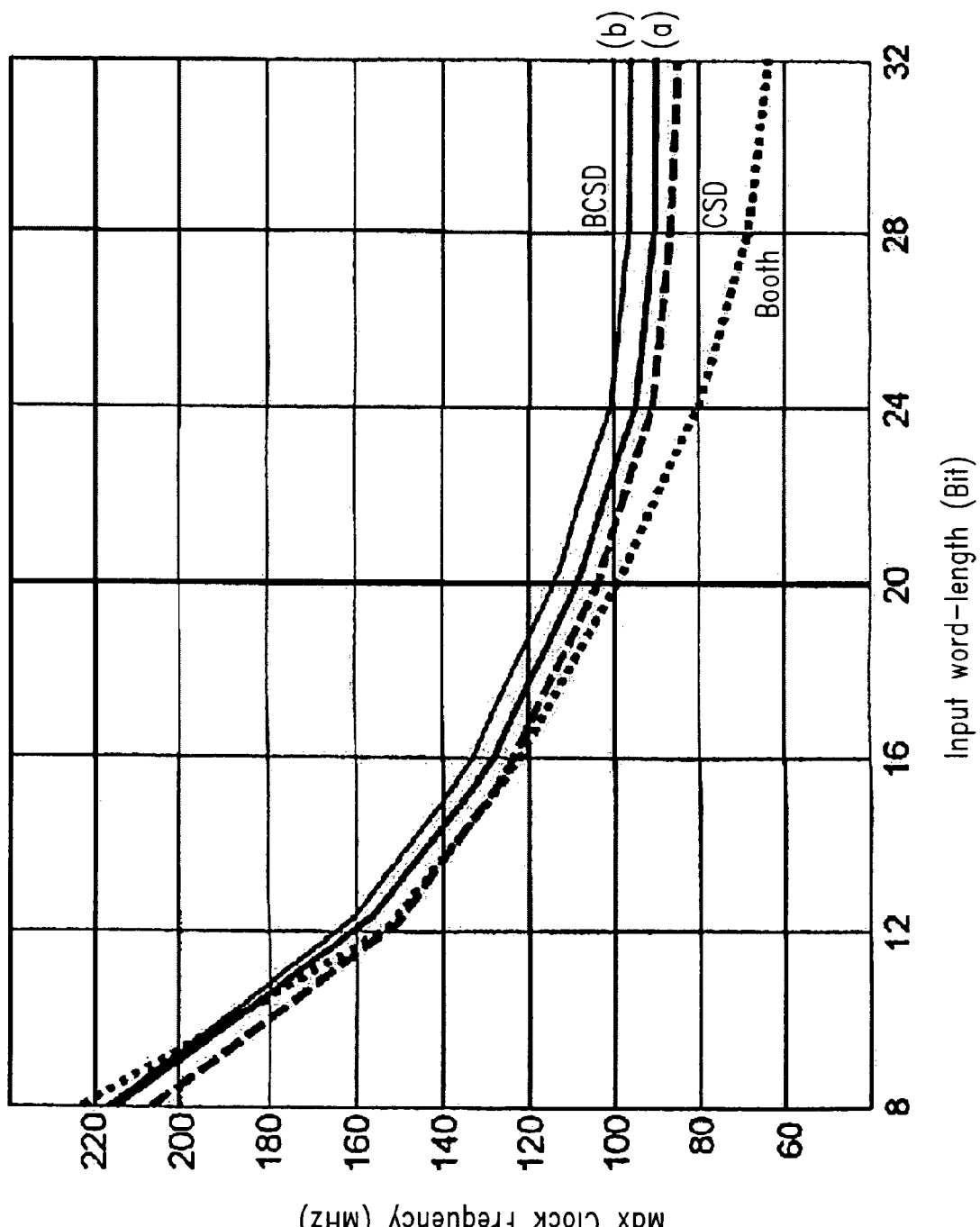
FIG. 22 shows the speed comparison between multipliers.

Complexity and speed evaluation resulting from logical synthesis for the HCMOS9 technology are shown in FIGS. 21 and 22.

FIG. 21 shows the complexity comparison between multipliers.

FIG. 22 shows the speed comparison between multipliers.

The BCSD multiplier has been implemented by embedding the BCSD decoder only, thus assuming that the multiplicand is available in its BCSD representation, for both the standard (a) and the extended (b) BCSD decoding schemes.

To perform a fair comparison, both the CSD and the largely exploited signed digit modified Booth (Radix-4) multiplier have been implemented. For each of them, the same Wallace tree and Parallel-Prefix structures adopted for the BCSD multiplier have been employed.

Since CSD and Booth multipliers suffer the redundancies due to the ternary representation, they have been implemented as two's complement multipliers, thus embedding also the Booth and CSD encoding functions respectively.

It has to be noted that the BCSD multiplier embedding both the encoding and the decoding functions can be actually seen as a pure CSD multiplier, thus showing the same performance in terms of both complexity and speed.

It is noteworthy that the complexity gain of the BCSD multiplier with respect to the Booth and the CSD multipliers increases with the increasing of the input word-length. This is largely due to the presence of the encoding functions included in the Booth and the CSD multipliers, whose load becomes considerable even for modest word-lengths.

In terms of speed, both CSD and BCSD multipliers have almost the same behavior, which depends on the fact that CSD encoding has the same recursive nature of the BCSD decoding, even if the latter exhibits a smaller complexity which in turn results in an overall speed improvement.

The BCSD multiplier that makes use of the extended BCSD decoding performs better than the conventional scheme in terms of both complexity and speed; but as a drawback it requires an extra-bit for each BCSD encoded operand.

Moreover, if a very small-area is the primary need of the application, a BCSD encoder can be implemented, avoiding the complexity and attendant overhead due to the Parallel-Prefix structure and the adoption of the fast Carry Select Adder Wallace tree. In this case, synthesis results revealed a gain of more than 10% in terms of complexity with respect to the reference multiplier.

It has to be noted that, if a BCSD-coded version of x operand is available into a memory, then the BCSD encoder can be omitted from the multiplier, i.e., the multiplication for a pre-calculated coefficient exhibits a complexity reduction since only the BCSD decoder is needed (which is the less expensive part in terms of complexity).

To sum up, CSD numbers are well known in the literature, and can be conveniently used when performing some signal processing with fixed coefficient (static filters, fixed size FFTs), but they suffer the redundancy due to the ternary representation when applied to dynamic coefficients. In fact, an N-bit two's complement number needs 2N-digit to be mapped into a CSD number. When dealing with dynamic coefficients stored in a memory, CSD processing requires a memory that is twice the memory required by the two's complement.

The advantage of storing BCSD encoded coefficients is that it requires the same amount of memory required by the two's complement coefficients while maintaining all the advantages of the CSD processing. BCSD numbers stored in a memory must be efficiently decoded back to their CSD notation before they can be used in CSD processing. In this case, when the BCSD encoded numbers are available, only the BCSD decoder has to be implemented, with a considerable hardware saving.

Advantageously, the arrangement described herein can be incorporated in a system architecture as described, e.g., in the paper by Daniele Lo Iacono et al. "Serial Block Processing for Multi-Code WCDMA Frequency Domain Equalization"— Proc. of the IEEE Wireless Communications and Networking Conference WCNC 2005, New Orleans, La., March 2005, whose disclosure is incorporated herein by reference.

Specifically, while retaining the same architecture (see especially FIG. 11 of the paper by Lo Iacono et al.) the re-configurable FFT Radix-R butterfly can be implemented using BCSD multipliers instead of the traditional two's complement multipliers (such as the Booth Radix-4 multiplier). In that case, the corresponding Twiddles Factors ROM must hold BCSD twiddles, i.e., twiddles represented into their BCSD notation.

Since both the complexity and the speed bottlenecks of the FFT reside in the multipliers, the BCSD FFT exhibits improved performance over a traditional arrangement employing Booth multipliers in terms of both reduced complexity and increased speed. The size of the Twiddles ROM Bank is the same as in the conventional case when using a BCSD multiplier, and slightly larger in comparison with arrangements using Extended BCSD. In the latter case, the FFT itself shows the best performance.

It will be appreciated that both the x input vector (via the input RAM banks) and the X output vector are still two's complement number. Thus, there is no need to convert the input/output streams into BCSD (which is however the way a BCSD multiplier works).

Consequently, without prejudice to the underlying principle of the invention, the details and the embodiments may vary, also appreciably, with reference to what has been described by way of example only, without departing from the scope of the invention as defined by the annexed claims.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

The invention claimed is:

1. A method of processing digital signals in an electronic circuit, the method comprising the steps of:
    making the digital signals available in two's complement representation and converting the two's complement representation into Binary Canonic Signed Digit representation by a recussive detector function $b_{n+1} = (X_n + X_{n+1}) \cdot b_n + X_n \cdot X_{n+1}$ where $x_n, x_{n+1}$ are subsequent values of said digital signals (x) in the two's complement representation, and $b_n, b_{n+1}$ are subsequent values of said detector function, and
        said Binary Canonic signal digit (BCSD) representation is calculated as $(X_n)_B = X_n \otimes (b_{n-1} \cdot X_{n-1})$ where $(x_n)_B$ are subsequent values of said digital signal in Binary Canonic Signed Digit (BCSD) representation; and
    converting the digital signals made available in the Binary Canonic Signed Digit representation into the signals in Canonic Signed Digit representation for use in processing in the electronic circuit.

2. The method of claim 1, comprising the step of using sign-extended encoding for representing said digital signals in Binary Canonic Signed Digit representation.

3. The method of claim 1, wherein said processing includes a multiplication step involving said digital signals in said Canonic Signed Digit representation.

4. The method of claim 1, comprising the step of storing said digital signals in said Binary Canonic Signed Digit representation.

5. The method of claim 1, comprising the step of dynamically varying said digital signals during said processing.

6. A circuit for processing digital signals, the circuit including:
    an input circuit configured to make said digital signals available in two's complement representation and converting the two's complement representation into Binary Canonic Signed Digit representation by a recussive detector function $b_{n+1} = (X_n + X_{n+1}) \cdot b_n + X_n \cdot X_{n+1}$ where $x_n, x_{n+1}$ are subsequent values of said digital signals (x) in the two's complement representation, and $b_n, b_{n+1}$ are subsequent values of said detector function, and
        said Binary Canonic signal digit (BCSD) representation is calculated as $(X_n)_B = X_n \otimes (b_{n-1} \cdot X_{n-1})$ where $(x_n)_B$ are subsequent values of said digital signal in Binary Canonic Signed Digit (BCSD) representation; and
    a converter having a parallel-prefix structure adapted to convert the digital signals made available in the Binary Canonic Signed Digit representation into the Canonic Signed Digit representation signals for use in processing by the circuit for processing digital signals.

7. The circuit of claim 6, wherein said converter is configured for using sign-extended encoding for representing said digital signals Binary Canonic Signed Digit representation.

8. The circuit of claim 6, wherein the circuit comprises a multiplier adapted to be fed with said digital signals in said Canonic Signed Digit representation.

9. The circuit of claim 6, wherein input element includes a memory for storing said digital signals in said Binary Canonic Signed Digit representation.

10. The circuit of claim 6, wherein the circuit is configured to dynamically vary said digital signals during said processing.

* * * * *